(12) United States Patent
Lu

(10) Patent No.: US 12,685,201 B2
(45) Date of Patent: Jul. 14, 2026

(54) DIE-BONDING METHOD FOR PREVENTING DIE FROM BENDING

(71) Applicant: SAULTECH TECHNOLOGY CO., LTD., Zhubei City (TW)

(72) Inventor: Yen Hao Lu, Zhubei City (TW)

(73) Assignee: SAULTECH TECHNOLOGY CO., LTD., Hsinchu County (TW)

( * ) Notice: Subject to any disclaimer, the term of this patent is extended or adjusted under 35 U.S.C. 154(b) by 394 days.

(21) Appl. No.: 18/444,894

(22) Filed: Feb. 19, 2024

(65) Prior Publication Data

US 2025/0219017 A1     Jul. 3, 2025

(30) Foreign Application Priority Data

Jan. 3, 2024    (TW) ................................. 113100312

(51) Int. Cl.
*H10W 72/00*          (2026.01)
(52) U.S. Cl.
CPC .... *H10W 72/072* (2026.01); *H10W 72/07235* (2026.01)
(58) Field of Classification Search
CPC ......... H10W 72/072; H10W 72/07235; H10W 72/0711; H10W 72/20

USPC .......................................................... 438/135
See application file for complete search history.

(56) References Cited

U.S. PATENT DOCUMENTS

| | | | | |
|---|---|---|---|---|
| 2011/0237050 A1* | 9/2011 | Sugimura | ........... | H10P 72/7402 |
| | | | | 257/E21.599 |
| 2016/0336292 A1* | 11/2016 | Tian | .................... | H10W 72/072 |
| 2022/0271002 A1* | 8/2022 | Li | ......................... | H10W 20/40 |

* cited by examiner

*Primary Examiner* — Moazzam Hossain

(57)          ABSTRACT

A method for preventing die from bending is provided, including: disposing a plurality of solder balls between a circuit layer and a substrate; preheating the substrate and the glass carrier respectively with a temperature lower than the melting point of the solder balls; one of the substrate and the glass carrier being made of a first material, and the other made of a second material; the first material having a coefficient of thermal expansion less than the second material and a temperature higher than the second material, so that the substrate and the glass carrier remaining equal length during heating; heating the solder balls by a light source with a temperature higher than the melting point of the solder balls; and after solidifying the solder balls, fastening the circuit layer on the substrate, and the substrate and the glass carrier remaining equal length during cooling.

7 Claims, 9 Drawing Sheets

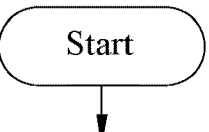

Start

Placing a substrate placed on a heating carrier plate, placing a die on the substrate, disposing a plurality of solder balls between a circuit layer of the die and the substrate, and a die-bonding device contacting a glass carrier of the die, both the die-bonding device and the glass carrier being light-transmissible, and the substrate and the glass carrier having equal length at room temperature    ～S10

The heating carrier plate heating the substrate and the substrate transferring the heat to the solder balls, the heating carrier plate being configured to have a heating temperature lower than melting point of the solder balls; the die-bonding device pressurizing and heating the glass carrier, the glass carrier transferring the heat to the solder balls through the circuit layer, the die-bonding device being configured to have a heating temperature lower than the melting point of the solder balls; one of the substrate and the glass carrier being made of a first material and the other one of the substrate and the glass carrier being made of a second material, the first material having a thermal expansion coefficient smaller than the second material, and having a temperature higher than the second material, so that the substrate and the glass carrier remaining equal-length during heating process    ～S20

A light source projecting a light passing through the die-bonding device and the glass carrier to heat up the circuit layer; the circuit layer transferring the heat to the solder balls, and the light source having a heating temperature exceeding the melting point of the solder balls so that the solder balls melted into liquid solder and penetrating into the substrate    ～S30

After solidifying the liquid solder, the circuit layer being completely fixed on the substrate, and the substrate and the glass carrier remaining equal-length during the process of cooling to room temperature.    ～S40

End

FIG. 1

DIE-BONDING METHOD FOR PREVENTING DIE FROM BENDING

BACKGROUND OF THE INVENTION

1. Field of the Invention

The present invention relates generally to a die-bonding method, and more particularly, to a die-bonding method for preventing die from bending.

2. The Prior Arts

The die-bonding process is a very important link in the back-end packaging of semiconductors. The use of heat and pressure to die-bonding is one of the methods of die-bonding.

The conventional die-bonding method includes the following steps: a substrate is placed on a heating carrier, a die is arranged on the substrate, a plurality of solder balls are arranged between a circuit layer of the die and the substrate, and a die-bonding device is in contact with a glass carrier plate of the die; the heating carrier plate heats the substrate, and the substrate transfers the heat to the solder balls, and the heating temperature of the heating carrier plate exceeds the melting point of the solder balls; the die-bonding device heats the glass carrier plate with pressurized heating, the glass carrier transfers heat to the solder balls through the circuit layer, and the heating temperature of the die-bonding device exceeds the melting point of the solder balls; the solder balls melt into liquid solder and penetrate into the substrate; and after the liquid solder solidifies, the circuit layer is completely fixed to the substrate.

However, because the thermal expansion coefficients of the substrate and the glass carrier are different and the heating temperature of the heating carrier and the heating temperature of the die-bonding device exceed the melting point of the solder balls, the substrate and the glass carrier are under the same temperature change conditions. Under the same condition, the one with a larger thermal expansion coefficient has a longer length, and the one with a smaller thermal expansion coefficient has a shorter length. As the temperature increases or decreases, the difference in length changes between the substrate and the glass carrier becomes more significant, eventually leading to warping of the dies.

SUMMARY OF THE INVENTION

A primary objective of the present invention is to provide a die-bonding for preventing die from bending, by controlling the temperature of the substrate and the glass carrier according to the difference in thermal expansion coefficient to achieve the purpose of preventing die from bending.

In order to achieve the aforementioned objectives, the present invention provides a die-bonding method for preventing die from bending, which includes the following steps:

placing a substrate placed on a heating carrier plate, placing a die on the substrate, disposing a plurality of solder balls between a circuit layer of the die and the substrate, and a die-bonding device contacting a glass carrier of the die, both the die-bonding device and the glass carrier being light-transmissible, and the substrate and the glass carrier having equal length at room temperature;

the heating carrier plate heating the substrate and the substrate transferring the heat to the solder balls, the heating carrier plate being configured to have a heating temperature lower than melting point of the solder balls; the die-bonding device pressurizing and heating the glass carrier, the glass carrier transferring the heat to the solder balls through the circuit layer, the die-bonding device being configured to have a heating temperature lower than the melting point of the solder balls; one of the substrate and the glass carrier being made of a first material and the other one of the substrate and the glass carrier being made of a second material, the first material having a thermal expansion coefficient smaller than the second material, and having a temperature higher than the second material, so that the substrate and the glass carrier remaining equal-length during heating process;

a light source projecting a light passing through the die-bonding device and the glass carrier to heat up the circuit layer; the circuit layer transferring the heat to the solder balls, and the light source having a heating temperature exceeding the melting point of the solder balls so that the solder balls melted into liquid solder and penetrating into the substrate; and after solidifying the liquid solder, the circuit layer being completely fixed on the substrate, and the substrate and the glass carrier remaining equal-length during the process of cooling to room temperature.

In a preferred embodiment, the light source includes a quartz lamp, and the infrared rays projected by the quartz lamp pass through the die-bonding device and the glass carrier to heat up the circuit layer.

In a preferred embodiment, the light source further includes a reflector, and the quartz lamp tube is disposed in the reflector and projects infrared rays toward the opening of the reflector.

In a preferred embodiment, the light source further includes a convex lens, the convex lens is disposed between the quartz lamp and the die-bonding device, the quartz lamp projects infrared rays toward the convex lens, and the convex lens focuses the infrared rays.

In a preferred embodiment, the light source includes a laser module, and the laser beam projected by the laser module passes through the die-bonding device and the glass carrier to heat up the circuit layer.

In a preferred embodiment, the heating temperature of the die-bonding device is between 140° C. and 270° C., and the heating temperature of the heating carrier plate is between 140° C. and 270° C.

In a preferred embodiment, the size of the die-bonding device is larger than the size of the die.

The effect of the present invention is that during the process of heating the solder balls, the present invention can control the temperatures of the first material and the second material respectively according to the difference in thermal expansion coefficient, so that the substrate and the glass carrier can operate under different temperature change conditions; whether during heating up or cooling down, the length of the substrate and the length of the glass carrier are always kept equal, thereby avoiding die bending and residual internal stress.

BRIEF DESCRIPTION OF THE DRAWINGS

The present invention will be apparent to those skilled in the art by reading the following detailed description of a preferred embodiment thereof, with reference to the attached drawings, in which:

FIG. 1 is a flowchart of the die-bonding method for preventing die from bending according to the present invention.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 2:
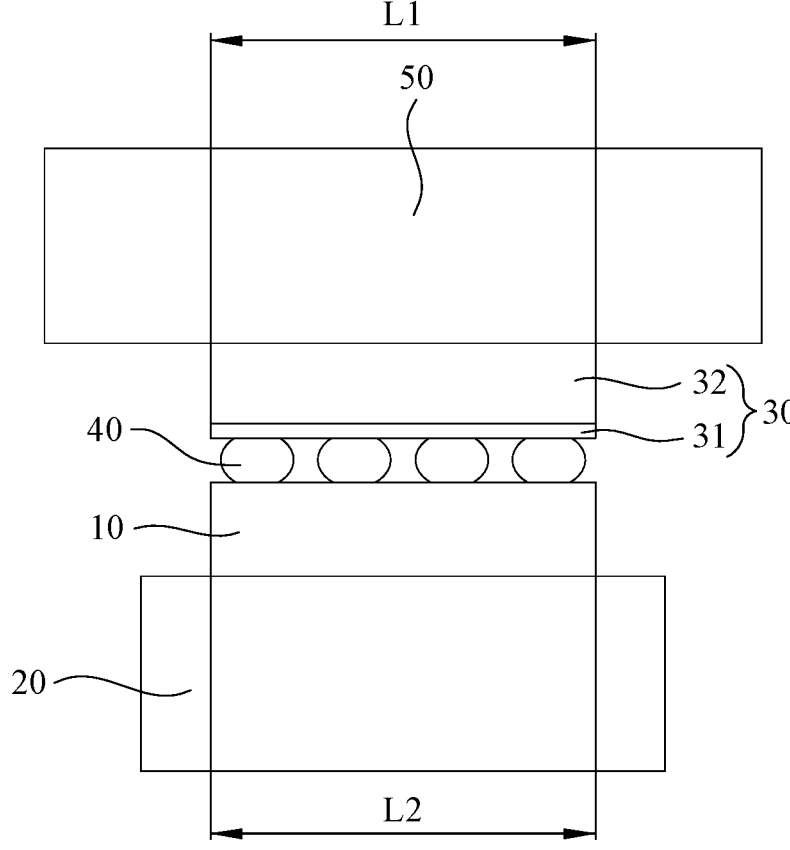
FIG. 2 is a schematic view of step S10 of the die-bonding method for preventing die from bending according to the present invention.
Figure 3:
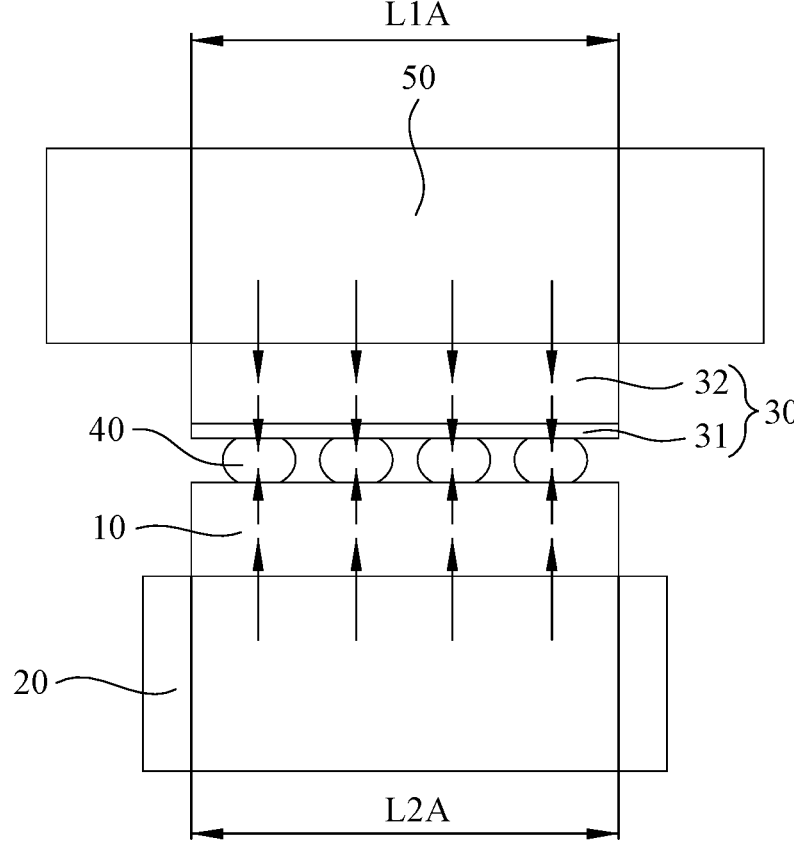
FIG. 3 is a schematic view of step S20 of the die-bonding method for preventing die from bending according to the present invention.
Figure 4:
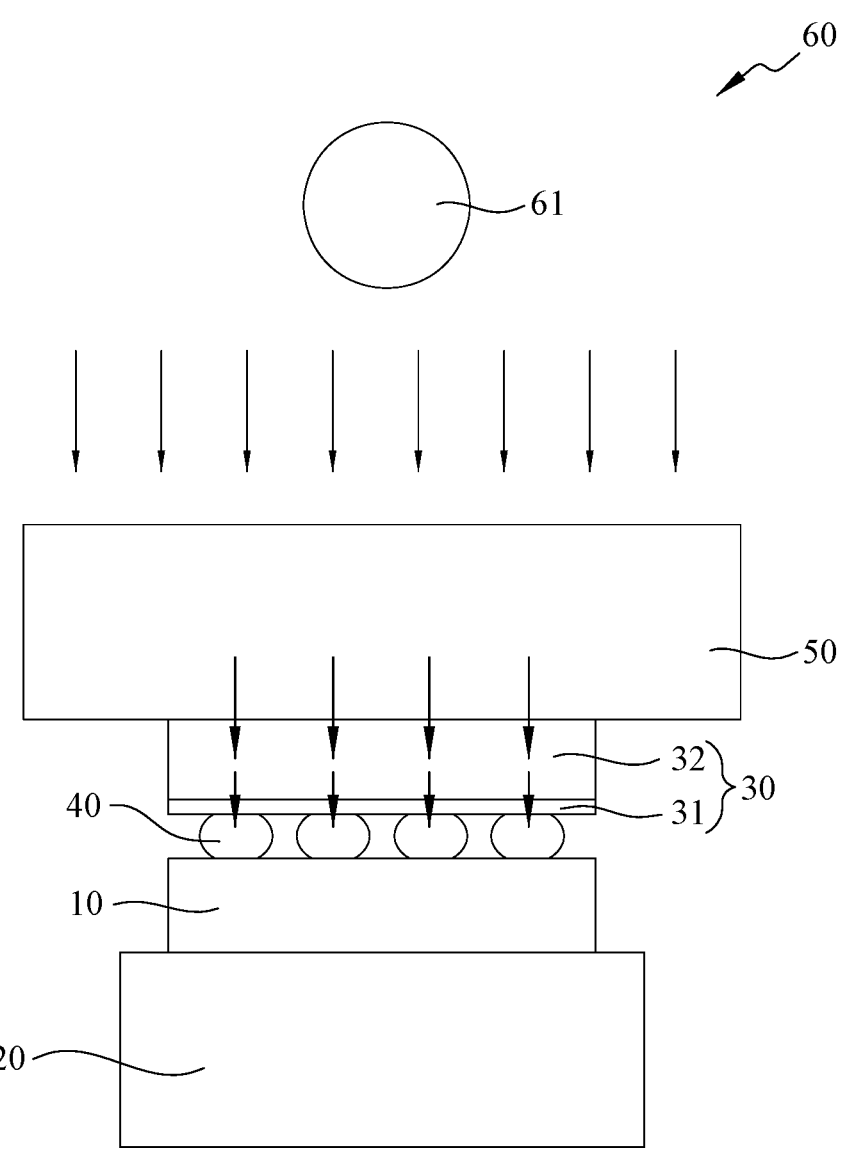
FIG. 4 is a schematic view of step S30 of the first embodiment of the die-bonding method for preventing die from bending of the present invention.
Figure 5:
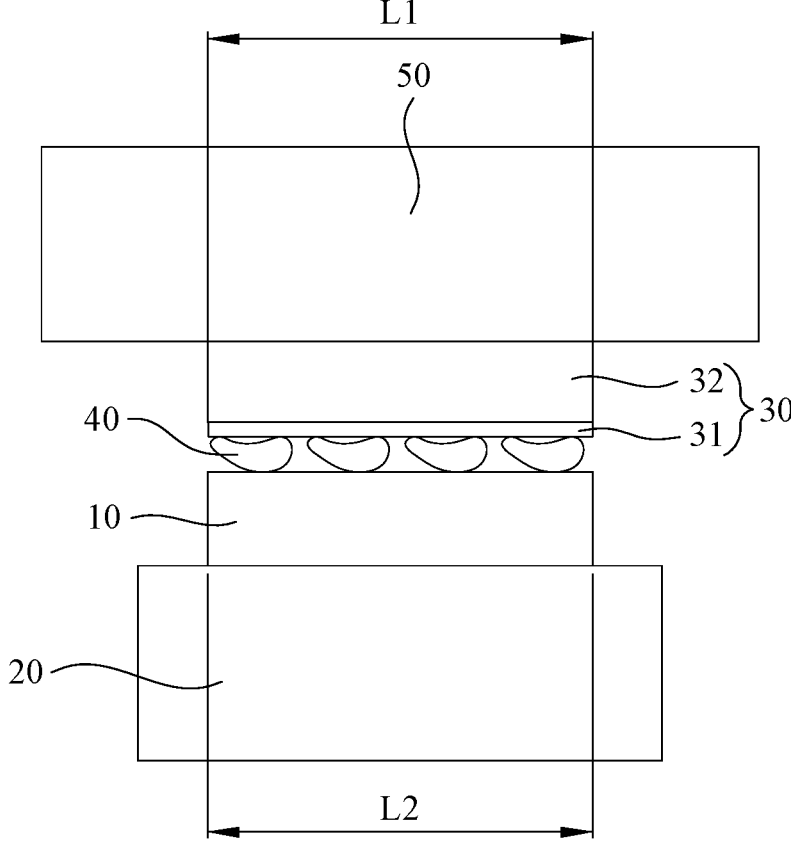
FIG. 5 is a schematic view of step S40 of the die-bonding method for preventing die from bending according to the present invention.
Figure 6:
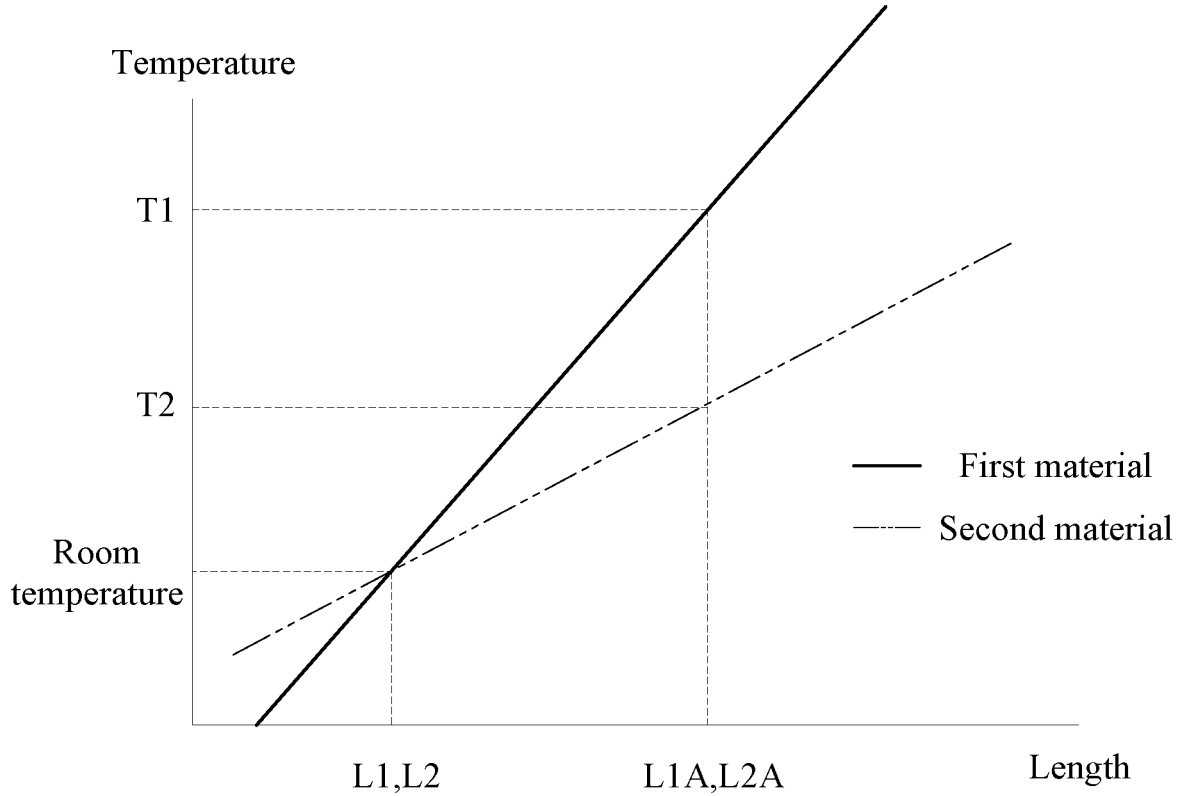
FIG. 6 is a thermal expansion curve diagram of the first material and the second material of the die-bonding method for preventing die from bending according to the present invention.

Refer to FIGS. 1-6. FIG. 1 is a flowchart of the die-bonding method for preventing die from bending according to the present invention. FIG. 2 is a schematic view of step S10 of the die-bonding method for preventing die from bending according to the present invention. FIG. 3 is a schematic view of step S20 of the die-bonding method for preventing die from bending according to the present invention. FIG. 4 is a schematic view of step S30 of the first embodiment of the die-bonding method for preventing die from bending of the present invention. FIG. 5 is a schematic view of step S40 of the die-bonding method for preventing die from bending according to the present invention. FIG. 6 is a thermal expansion curve diagram of the first material and the second material of the die-bonding method for preventing die from bending according to the present invention. The invention provides a die-bonding method to prevent die from bending, which includes the following steps:

Step S10, as shown in FIGS. 1, 2 and 6, a substrate 10 is placed on a heating carrier plate 20, a die 30 is placed on the substrate 10, and a plurality of solder balls 40 is placed between a circuit layer 31 of the die 30 and the substrate 10; a die-bonding device 50 contacts a glass carrier 32 of the die 30. Both the die-bonding device 50 and the glass carrier 32 are light-transmissive, and the length L1 of the substrate 10 is equal to the length L2 of the glass carrier 32 at room temperature.

Step S20, as shown in FIGS. 1 and 3, the heating carrier plate 20 heats the substrate 10, and the substrate 10 transfers the heat to the solder balls 40, and the heating temperature of the heating carrier plate 20 is lower than the melting point of the solder balls 40; as shown in FIGS. 1 and 3, the die-bonding device 50 pressurizes and heats the glass carrier 32, and the glass carrier 32 transfers the heat to the solder balls 40 through the circuit layer 31, and the heating temperature of the die-bonding device 50 is lower than the melting point of the solder balls 40; and as shown in FIGS. 1, 3 and 6, one of the substrate 10 and the glass carrier 32 is made of a first material, and the other of the substrate 10 and the glass carrier 32 is made of a second material, the thermal expansion coefficient of the first material is smaller than the thermal expansion coefficient of the second material, and the temperature T1 of the first material is higher than the temperature T2 of the second material, so that the length L1A of the substrate 10 and the length L2A of the glass carrier 32 remain equal during the temperature increasing process.

Step S30, as shown in FIGS. 1 and 4, the light projected by a light source 60 passes through the die-bonding device 50 and the glass carrier 32 to heat up the circuit layer 31, and the circuit layer 31 transfers the heat to the solder balls 40. The heating temperature of the light source 60 exceeds the melting point of the solder balls 40, so that the solder balls 40 melt into liquid solder and penetrate into the substrate 10.

Step S40, as shown in FIGS. 1 and 5, after the liquid solder solidifies, the circuit layer 31 is completely fixed on the substrate 10, and the length L1 of the substrate 10 and the length L2 of the glass carrier 32 remain equal during the process of cooling to room temperature.

Thereby, the present invention can control the heating temperatures for the first material and the second material according to the difference in thermal expansion coefficient during the process of heating the solder ball 40, so that the substrate 10 and the glass carrier 32 are under different temperature conditions. Whether the temperature is rising or cooling, the length of the substrate 10 and the length of the glass carrier 32 are always maintained equal, thereby preventing the crystal grains 30 from bending and residual internal stress.

In the first embodiment, the heating temperature of the die-bonding device 50 is between 140° C. and 270° C., and the heating temperature of the heating carrier plate 20 is between 140° C. and 270° C. To be more specific, the melting point of the solder ball 40 varies depending on its composition. Since the melting point of the solder ball 40 selected during die bonding usually exceeds 270° C., the heating temperature of the die-bonding device 50 and the heating carrier plate 20 must be lower than 270° C. to prevent the solder ball 40 from melting into liquid solder. If the heating temperature of the die-bonding device 50 and the heating carrier plate 20 is lower than 140° C., the light source 60 will take a much longer time to melt the solder ball 40 into liquid solder, thereby reducing the welding efficiency. Therefore, the method of the present invention controls the heating temperature between 140° C. and 270° C., which can ensure that the solder ball 40 has a sufficient heating temperature without melting into liquid solder, thereby improving the welding efficiency.

In the first embodiment, the size of the die-bonding device 50 is larger than the size of the die 30. Therefore, the die-bonding device 50 can pressurize and heat up the die 30 with a relatively uniform pressure and temperature to prevent the die 30 from bending.

Preferably, step S30 further includes: the light source 60 includes a quartz lamp 61, and the infrared rays projected by the quartz lamp 61 pass through the die-bonding device 50 and the glass carrier 32 to heat up the circuit layer 31.

5

Figure 7:
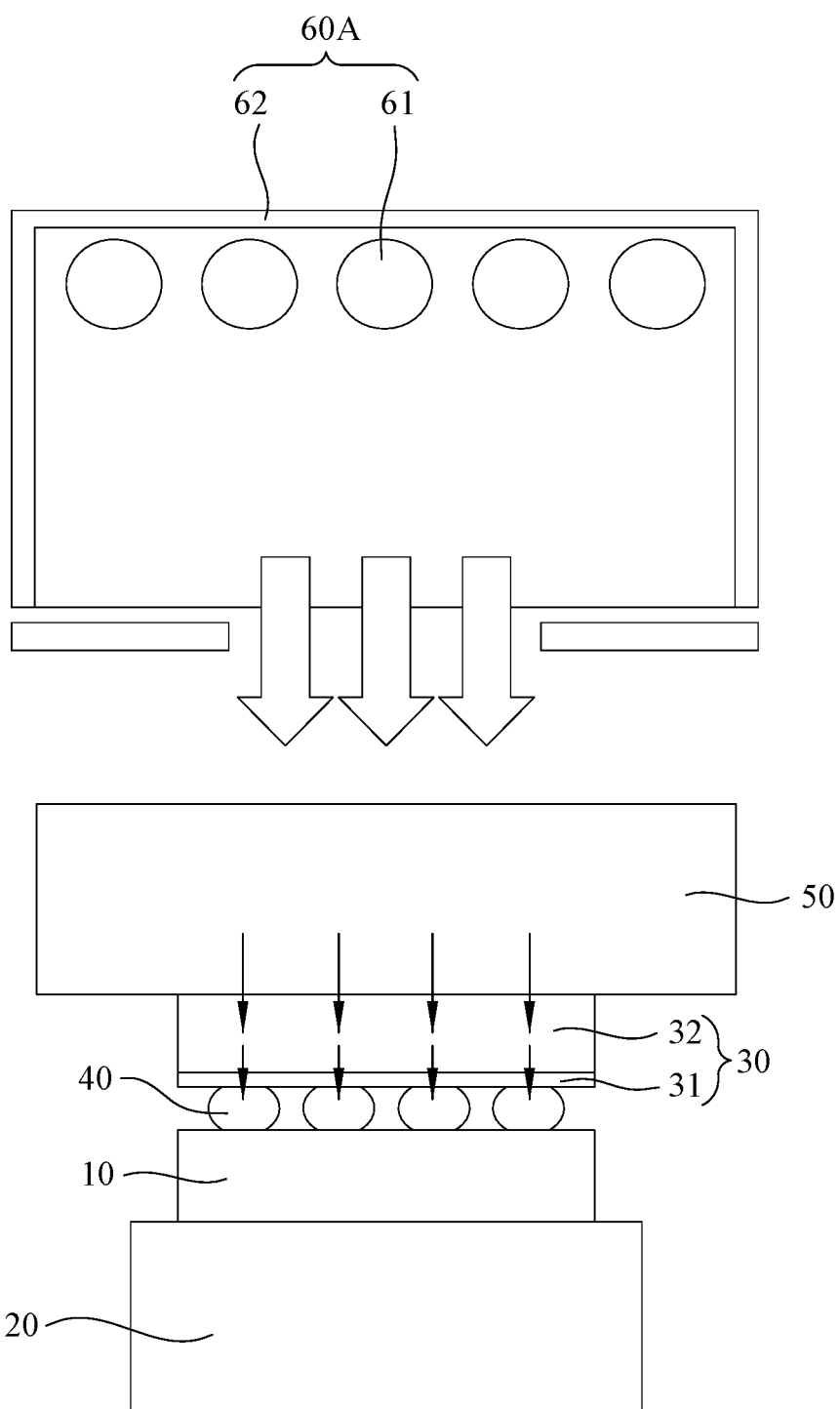
FIG. 7 is a schematic view of step S30 of the second embodiment of the die-bonding method for preventing die from bending of the present invention.

FIG. 7 is a schematic view of step S30 of the second embodiment of the die-bonding method for preventing die from bending according t the present invention. As shown in FIG. 7, the difference between the second embodiment and the first embodiment is that in step S30, the light source 60A further includes a reflector 62. The quartz lamp 61 is disposed in the reflector 62 and projects infrared rays toward the opening of the reflector 62.

Figure 8:
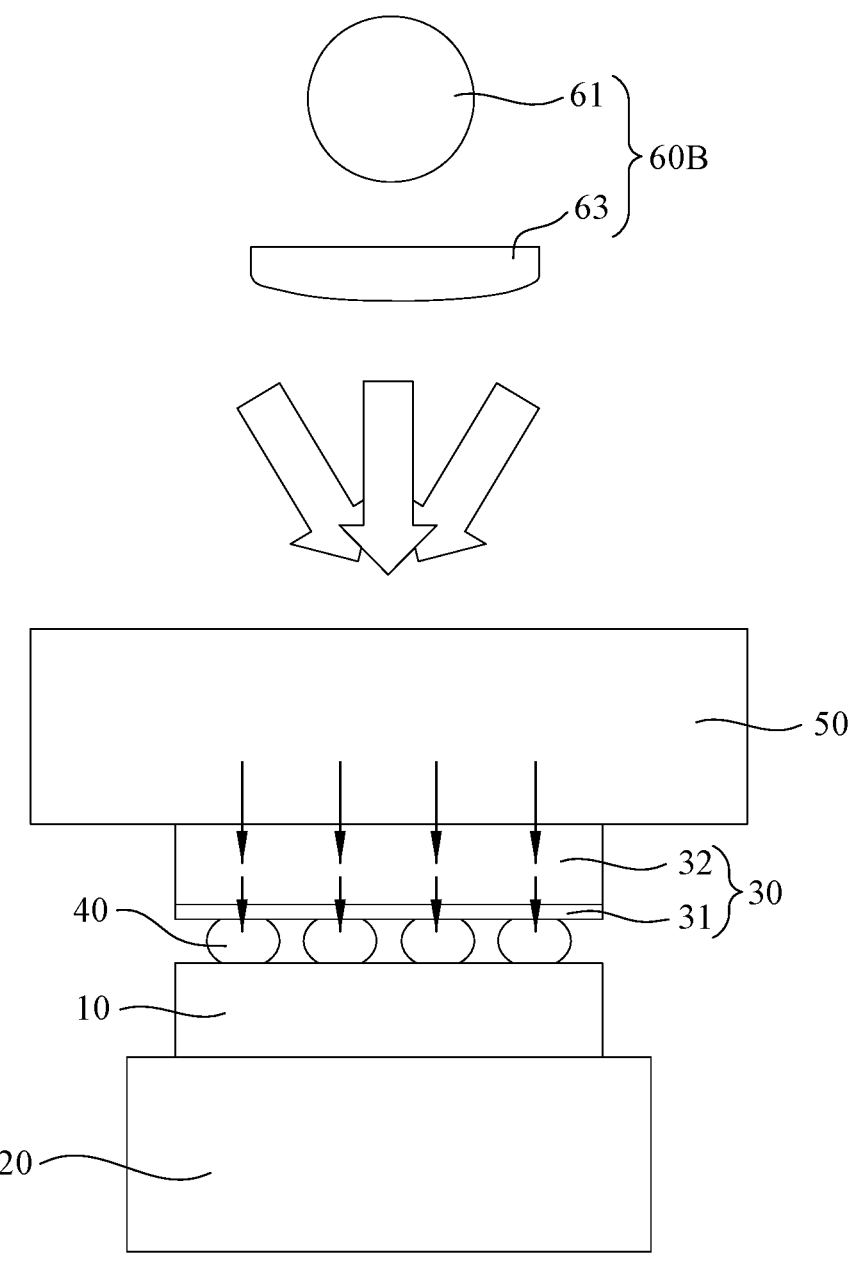
FIG. 8 is a schematic view of step S30 of the third embodiment of the die-bonding method for preventing die from bending of the present invention.

FIG. 8 is a schematic view of step S30 of the third embodiment of the die-bonding method for preventing die from bending according to the present invention. As shown in FIG. 8, the difference between the third embodiment and the first embodiment is that in step S30, the light source 60B further includes a convex lens 63. The convex lens 63 is disposed between the quartz lamp 61 and the die-bonding device 50. The quartz lamp 61 projects the infrared rays toward the convex lens 63 and the convex lens 63 focuses the infrared rays.

Figure 9:
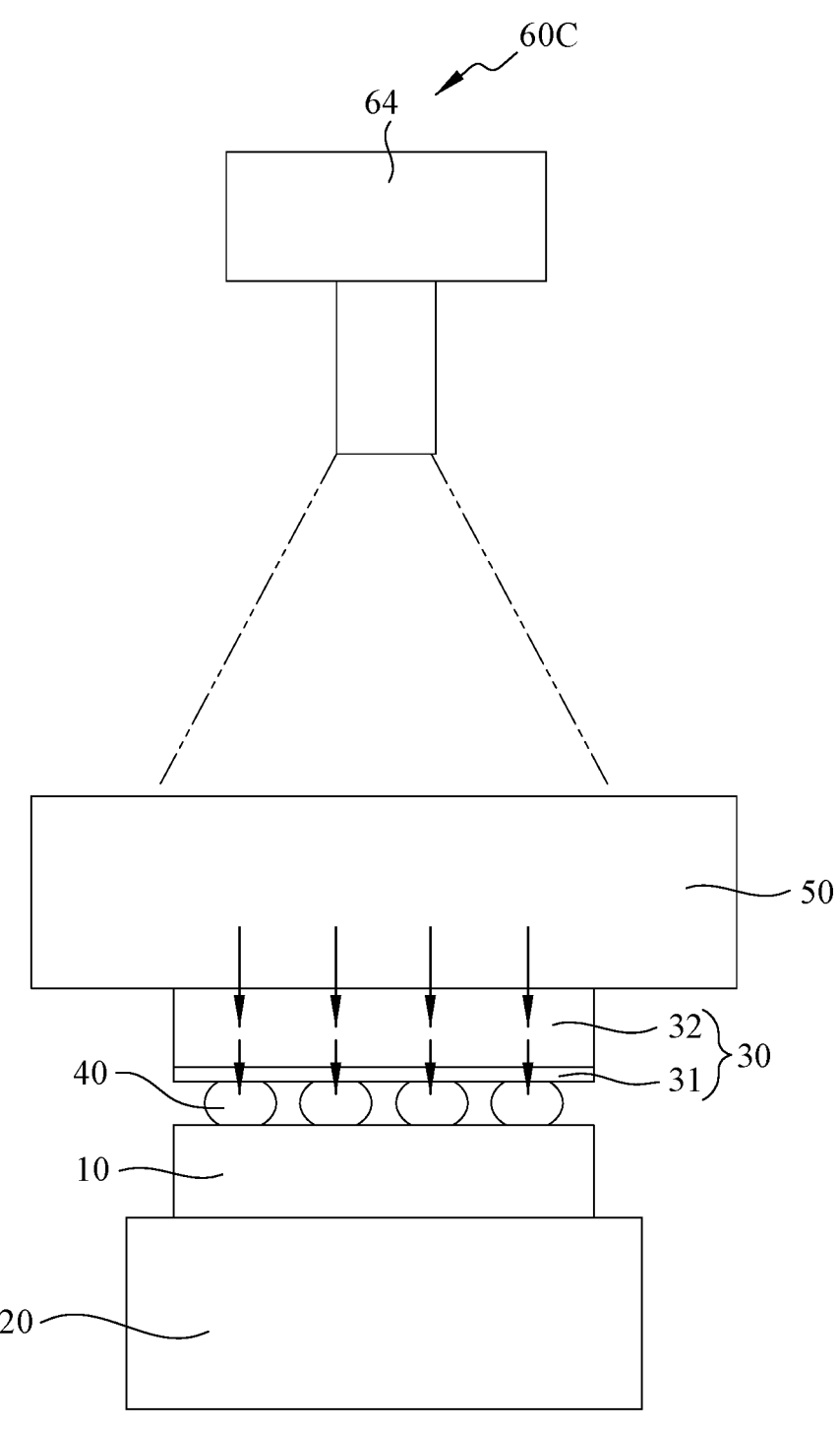
FIG. 9 is a schematic view of step S30 of the fourth embodiment of the die-bonding method for preventing die from bending of the present invention.

FIG. 9 is a schematic view of step S30 of the fourth embodiment of the die-bonding method for preventing die from bending according to the present invention. As shown in FIG. 9, the difference between the fourth embodiment and the first embodiment is that in step S30, the light source 60C is a laser module 64, and the laser beam projected by the laser module 64 passes through the die-bonding device 50 and the glass carrier 32 to heat up the circuit layer 31.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A die-bonding method for preventing die from bending, comprising:

placing a substrate placed on a heating carrier plate, placing a die on the substrate, disposing a plurality of solder balls between a circuit layer of the die and the substrate, and a die-bonding device contacting a glass carrier of the die, both the die-bonding device and the glass carrier being light-transmissible, and the substrate and the glass carrier having equal length at room temperature;

the heating carrier plate heating the substrate and the substrate transferring the heat to the solder balls, the heating carrier plate being configured to have a heating temperature lower than melting point of the solder balls; the die-bonding device pressurizing and heating the glass carrier, the glass carrier transferring the heat to the solder balls through the circuit layer, the die-bonding device being configured to have a heating temperature lower than the melting point of the solder balls; one of the substrate and the glass carrier being made of a first material and the other one of the substrate and the glass carrier being made of a second material, the first material having a thermal expansion coefficient smaller than the second material, and having a temperature higher than the second material, so that the substrate and the glass carrier remaining equal-length during heating process;

a light source projecting a light passing through the die-bonding device and the glass carrier to heat up the circuit layer; the circuit layer transferring the heat to the solder balls, and the light source having a heating temperature exceeding the melting point of the solder balls so that the solder balls melted into liquid solder and penetrating into the substrate; and after solidifying the liquid solder, the circuit layer being completely fixed on the substrate, and the substrate and the glass carrier remaining equal-length during the process of cooling to room temperature.

2. The die-bonding method for preventing die from bending according to claim 1, wherein the light source includes a quartz lamp, and the infrared rays projected by the quartz lamp pass through the die-bonding device and the glass carrier to heat up the circuit layer.

3. The die-bonding method for preventing die from bending according to claim 2, wherein the light source further includes a reflector, and the quartz lamp tube is disposed in the reflector and projects infrared rays toward the opening of the reflector.

4. The die-bonding method for preventing die from bending according to claim 2, wherein the light source further includes a convex lens, the convex lens is disposed between the quartz lamp and the die-bonding device, the quartz lamp projects infrared rays toward the convex lens, and the convex lens focuses the infrared rays.

5. The die-bonding method for preventing die from bending according to claim 1, wherein the light source includes a laser module, and the laser beam projected by the laser module passes through the die-bonding device and the glass carrier to heat up the circuit layer.

6. The die-bonding method for preventing die from bending according to claim 1, wherein the heating temperature of the die-bonding device is between 140° C. and 270° C., and the heating temperature of the heating carrier plate is between 140° C. and 270° C.

7. The die-bonding method for preventing die from bending according to claim 1, wherein the size of the die-bonding device is larger than the size of the die.

* * * * *